(12) United States Patent
Capretta

(10) Patent No.: US 7,688,923 B2
(45) Date of Patent: Mar. 30, 2010

(54) ENHANCED DATA RATE RECEIVER

(75) Inventor: Pietro Capretta, Brussels (BE)

(73) Assignee: STMicroelectronics Belgium NV, Zaventem (BE)

( * ) Notice: Subject to any disclaimer, the term of this patent is extended or adjusted under 35 U.S.C. 154(b) by 813 days.

(21) Appl. No.: 11/503,415

(22) Filed: Aug. 11, 2006

(65) Prior Publication Data

US 2007/0037511 A1    Feb. 15, 2007

(30) Foreign Application Priority Data

Aug. 12, 2005   (EP)   ................... 05447184

(51) Int. Cl.
*H04B 1/10*   (2006.01)
(52) U.S. Cl. .................. 375/350; 375/316; 375/354; 375/222; 375/261; 341/139; 341/156; 341/158
(58) Field of Classification Search ................ 375/354, 375/147, 260, 316, 261, 331, 350, 222; 455/3.01; 341/139, 156, 158, 61, 120
See application file for complete search history.

(56) References Cited

U.S. PATENT DOCUMENTS

| | | | |
|---|---|---|---|
| 5,513,209 A | 4/1996 | Holm | |
| 5,579,345 A | 11/1996 | Kroeger et al. | |
| 5,768,311 A * | 6/1998 | Betts et al. | ............. 375/222 |
| 5,946,359 A | 8/1999 | Tajiri et al. | |
| 6,470,056 B1 | 10/2002 | Kurihara et al. | |
| 6,496,546 B1 * | 12/2002 | Allpress et al. | ............. 375/316 |
| 6,560,294 B1 * | 5/2003 | Gatherer | ............. 375/261 |
| 7,456,857 B2 * | 11/2008 | Yamamoto | ............. 348/14.02 |
| 2001/0048723 A1 * | 12/2001 | Oh | ............. 375/261 |
| 2002/0147595 A1 * | 10/2002 | Baumgarte | ............. 704/500 |
| 2006/0210055 A1 * | 9/2006 | Hauser et al. | ............. 379/399.01 |

FOREIGN PATENT DOCUMENTS

| | | |
|---|---|---|
| EP | 0 872 985 A2 | 10/1998 |
| EP | 0 892 528 A2 | 1/1999 |

OTHER PUBLICATIONS

European Search Report from European Patent Application 05447184, filed Aug. 12, 2005.
European Search Report from European Patent Application 05447185, filed Aug. 12, 2005.

(Continued)

*Primary Examiner*—Chieh M Fan
*Assistant Examiner*—Eva Y Puente
(74) *Attorney, Agent, or Firm*—Lisa K. Jorgenson; James H. Morris; Wolf, Greenfield & Sacks, P.C.

(57) ABSTRACT

A receiver having circuitry for generating first digitized samples from a received analog signal at a first sampling rate, e.g. an ADC. An interpolating filter is used to generate second digitized samples which are estimates of samples obtainable by sampling the received analog signal at a second sample rate lower than the first sampling rate, second digitized samples being output at the first sampling rate and including at least one unusable sample. A circuit is provided for generating a signal for controlling components of the receive path downstream of the interpolation filter to prevent processing of the unusable second digitized samples.

20 Claims, 4 Drawing Sheets

OTHER PUBLICATIONS

European Search Report from European Patent Application 05447183, filed Aug. 12, 2005.

European Search Report from European Patent Application 05447182, filed Aug. 12, 2005.

Rice, M. et al. "Polyphase filterbanks for symbol timing synchronization in sampled data receivers" Military Communications Conference. MILCOM 2002. Proceedings. Anaheim, CA, Oct. 7-10, 2002, IEEE Military Communications Conference, New York, NY: IEEE, US, vol. vol. 1 of 2, Oct. 7, 2002, pp. 982-986, XP010631909 ISBN: 0-7803-7625-0.

Min J. et al. "Synchronization techniques for a frequency-hopped wireless transceiver" Vehicular Technology for the Human Race., IEEE 46$^{th}$ Atlanta, GA, USA Apr. 28-May 1, 1996, New York, NY, USA, IEEE, US vol. 1, Apr. 28, 1996, pp. 183-187, XP010162373 ISBN: 0-7803-3157-5.

Henker M., et al. "Time-variant CIC-filters for sample rate conversion with arbitrary rational factors" Electronics, Circuits and Systems, 1999. Proceedings of ICECS '99. The 6$^{th}$ IEEE International Conference on Pafos, Cyprus, Sep. 5-8, 1999, Picsataway, NJ, USA, IEEE, US, vol. 1, Sep. 5, 1999, pp. 67-70, XP010361448 ISBN: 0-7803-5682-9.

Gardner F. M. "Interpolation in Digital Modems. \Part I: Fundamentals" IEEE Transactions on Communications, IEEE Service Center, Piscataway, NJ, US, vol. 41, No. 3, Mar. 1, 1993, pp. 501-507, XP000372693, ISSN: 0090-6778.

* cited by examiner

ENHANCED DATA RATE RECEIVER

BACKGROUND OF THE INVENTION

1. Field of the Invention

The present invention relates to telecommunication systems especially wireless systems, wireless transmitters and wireless receivers, especially those using the Bluetooth standard. The present invention also relates to semiconductor integrated circuits that implement a wireless receiver and/or a wireless transmitter especially those using the Bluetooth standard, as well as software for implementing the transmitter and/or receiver.

2. Technical Background

Version 2.0 +EDR of the Bluetooth standards introduces an Enhanced Data Rate (EDR) operation. The EDR standard is an improvement over the Basic Rate standard. New modulation schemes: π/4-DQPSK and 8DPSK, are proposed. The bandwidth of the channel is 1 MHz.

In the digital part of the receiver an SRRC filter is proposed which is matched with the SRRC filter used in transmitter. This filter behavior has been selected for Bluetooth EDR specifications to achieve a Raised Cosine (RC) filter in order to reduce the level of Intersymbol Interference (ISI). These matched filters result in a Raised Cosine Channel response. This channel, when given additional phase and amplitude compensation, will yield no ISI.

A Bluetooth transmitter is shown schematically in FIG. 1. The bits for transmission arrive at 2 Mbps or 3 Mbps and are coded in symbols "an" at 1 Msymbol per second. So the symbol time period T is 1 μs. The symbols are shaped with the SRRC and the modulated signal at digital level can be produced using any whole multiple of 1 MHz. For example, 13 MHz can be used as this is an available clock in a Bluetooth system. Finally a Digital to analog converter (DAC) is used to produce the analog modulated signal to be sent to the analog part of the transmitter.

A Bluetooth receiver has an analog front end and a digital part. At the Analog to Digital converter (ADC) in a Bluetooth receiver there are two simple possibilities for the sampling frequency: 13 MHz or 6.5 MHz. When operating at a sampling frequency of 6.5 MHz, theoretically the SRRC-receive filters (SRRC-Rx) could be matched to the SRRC-transmit filter (SRRC-Tx). However, after the SRRC-Rx filter, a sampled signal by 1 MHz frequency value is required as a digitized input for the demodulation block. The sampling frequency for the receiver has to be an integer multiple of the output frequency value of 1 MHz. Therefore, the implementation of the 6.5 MHz sampling frequency in the digital part of the receiver requires a preliminary block sampling at a whole multiple frequency of 1 MHz to obtain an equivalent digitized signal. This solution however requires generation of a sampling frequency at a whole multiple frequency of 1 MHz. The additional oscillator required to generate a whole multiple frequency of 1 MHz takes up chip area and increases power consumption. The alternative—sampling at 13 MHz—increases the complexity of the demodulator block, increases power consumption and cost.

SUMMARY OF THE INVENTION

It is an object of the present invention to provide a receiver for a wireless telecommunications device which has a low power consumption. An advantage of the present invention is that a wireless receiver such as a Bluetooth receiver can be implemented with a low power consumption and with a good sensitivity without having to provide an additional oscillator for generating a whole multiple frequency of the baseband signal frequency. A further advantage is that the receiver can be an Enhanced Data Rate receiver, i.e. one using an M-state phase modulation especially an M-state differential phase modulation with M equal to or greater than 2.

In one aspect the present invention provides a receive path in a receiver comprising:

a means for generating first digitized samples from a received analog signal at a first sampling rate, an interpolating filter to generate second digitized samples which are estimates of samples obtainable by sampling the received analog signal at a second sample rate lower than the first sampling rate, second digitized samples being output at the first sampling rate and including at least one unusable sample, and a circuit for generating a signal for controlling components of the receive path downstream of the interpolation filter to prevent processing of the unusable second digitized samples. The advantage of this arrangement is that a separate oscillator at the second sampling rate is not required while still allowing the second sampling rate to be a whole multiple of the baseband signal rate which is 1 MHz for Bluetooth.

The second digitized samples can be fed to an SRRC filter. The SRRC filter is configured to process samples at the second sample rate. The use of n SRRC filter in the receive path matched to an SRRC filter in the transmitter provides advantages in eliminating ISI.

The circuit for generating a signal can be a counter that transmits a signal at a certain count value of samples e.g. every time an unusable sample is to be processed by downstream components. A counter is a simple circuit which is cost-effective and takes up little chip area.

The first sampling rate can be a fractional multiple of the baseband signal rate, e.g. 6.5 MHz and the second sampling rate can be a whole integer number multiple of the baseband signal rate, e.g. 6 MHz. 6.5 MHz is an available frequency in a Bluetooth receiver and does not require a separate oscillator. 6 MHz is a whole multiple of 1 MHz, the symbol rate for Bluetooth.

means for generating first digitized samples can be an analog to digital converter. This component is standard for many receivers. According to the invention the analog to digital converter, the interpolation filter and the SRRC filter are all clocked at the same frequency. This avoids additional oscillators.

The receiver can be a Bluetooth receiver. In particular the receiver can be an enhanced data rate receiver. The receiver may be implemented as an integrated circuit. The present invention also provides a method of operating a receiver comprising:

generating first digitized samples from a received analog signal at a first sampling rate, interpolating the first digitized samples to generate second digitized samples which are estimates of samples obtainable by sampling the received analog signal at a second sample rate lower than the first sampling rate, second digitized samples being output at the first sampling rate and including at least one unusable sample, and controlling components of the receive path downstream of the interpolation filter to prevent processing of the unusable second digitized samples.

The method may include a step of downconverting a received wireless signal into a lower frequency analog signal, the downconverting step being followed by a digitization step on said lower frequency analog signal such as to obtain the in-phase component and the orthogonal phase component of the digital baseband signal.

Alternatively, digitization can include an analog/digital conversion followed by a digital downconversion such as to obtain said in-phase component and said orthogonal phase component. The digitization step may include oversampling. An optional vector product step may also be applied.

The present invention also includes software for implementing any of the devices or methods of the present invention. The software may be stored on a suitable machine readable storage medium such as diskettes, an optical disk such as CD-ROM or DVD-ROM, a hard disk, in a computer memory, in a solid state memory, on magnetic tape, etc.

DETAILED DESCRIPTION

The present invention will be described with reference to certain drawings and to certain embodiments but this description is by way of example only.

Figure 1:
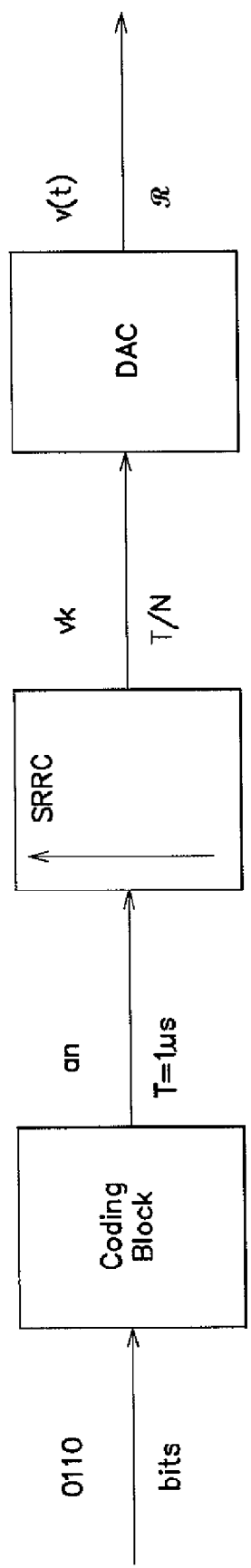
FIG. 1 is a schematic representation of a transmitter which may be used with a receiver according to the present invention.
Figure 2A:
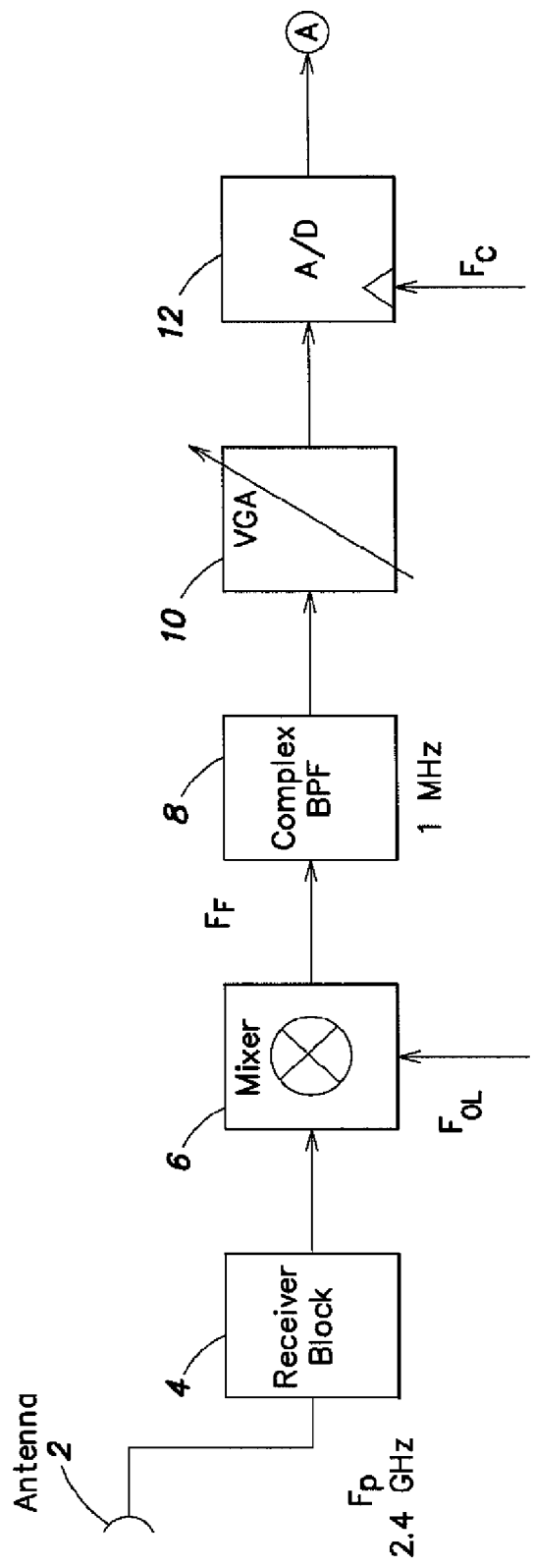
FIGS. 2A and 2B show a schematic representation of a receiver according to the present invention.
Figure 2B:
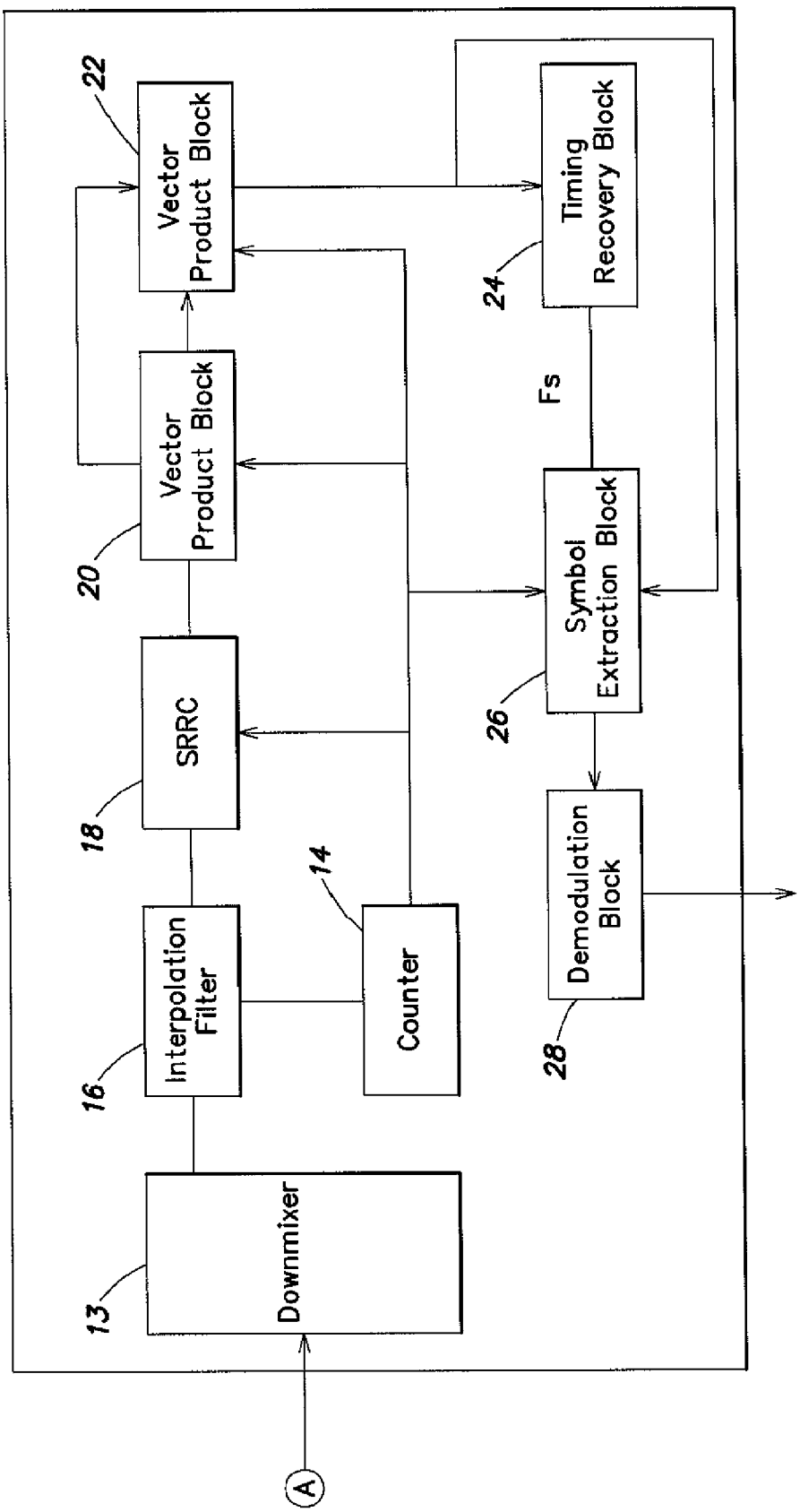
Figure 3:
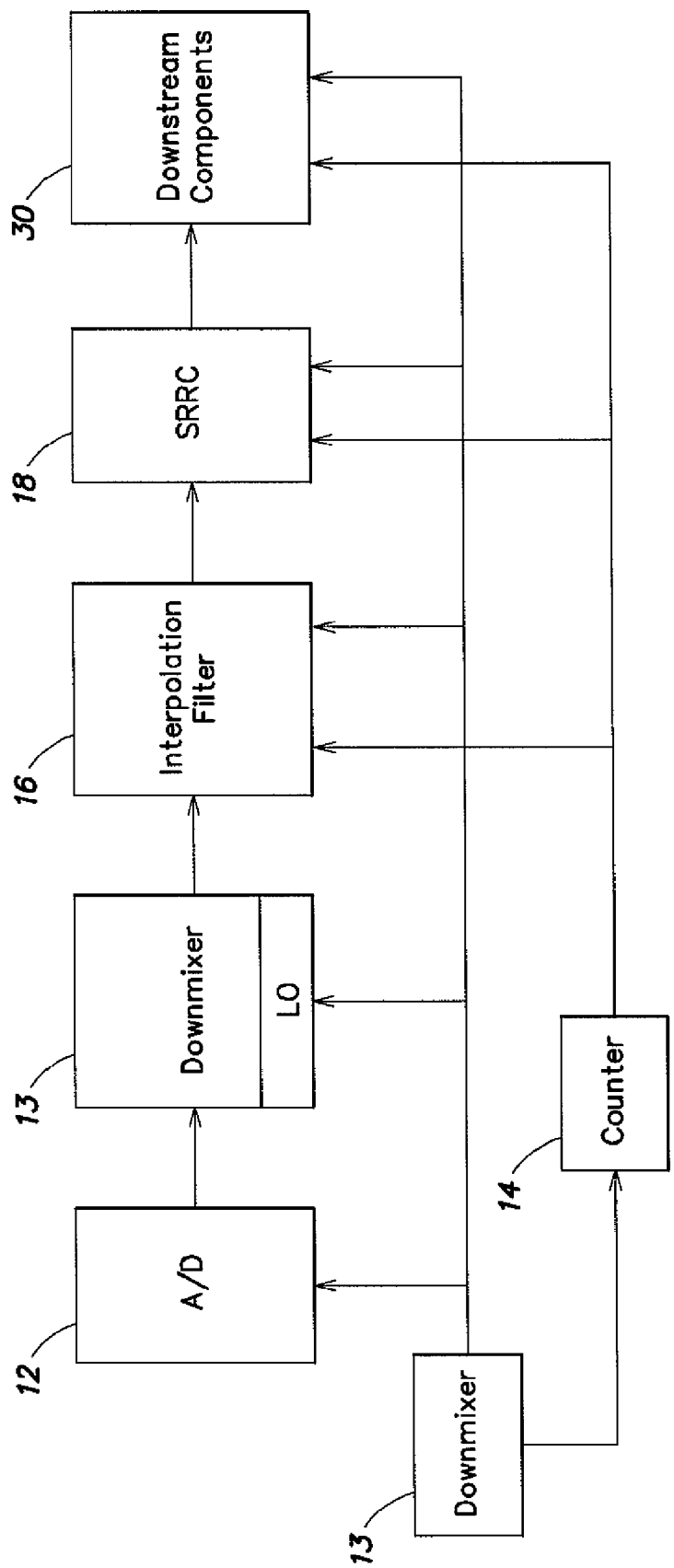
FIG. 3 is a detail of the receiver of FIGS. 2A and 2B.

FIGS. 2A and 2B show a schematic representation of a receiver e.g. a receiver of a wireless transceiver such as a Bluetooth transceiver, in accordance with an embodiment of the present invention. FIG. 3 shows a detail thereof. The analog radio front end is an example only and is not limiting of the present invention. In the radio front-end the RF filters, oscillators, and image-reject mixers process input signals at high frequencies. To keep costs down, the input signal can be shifted to a lower intermediate frequency which allows on-chip construction of low power filters. The RF transmitted signal centered on 2.4 GHz is received at an antenna 2 and filtered by the Reception band-pass filter 4. An analog Down-Mixer 6 and a Complex band pass filter 8 are then used to obtain the bandpass signal, which occupies a 1 MHz-band centered on the intermediate frequency. Although not shown, the local oscillator frequency ($F_{OL}$) value of the down-mixer can be modified by feedback control from the timing recovery block in the digital part (see later). A Voltage Gain Adaptation (VGA) block 10 can be used in order to adapt the signal amplitude to the input dynamic range of the other blocks in the device. In particular it controls the amplitude so as not to overrange the A/D converter 12. The signal is sampled with a sampling frequency $F_C$ equal to a fractional frequency of the baseband signal rate such as 6.5 MHz for Bluetooth and it is digitized using an A/D converter 12. The analog signal is oversampled by the AD converter 12. The signals from the ADC 12 may be fed to a downmixer 13 which combines the these signals with signals from a low frequency oscillator such as a numerically controlled oscillator operating at the baseband signal frequency of 1 MHz.

The present invention is based on the finding that the sampling frequency for both the DAC in the transmitter and the receiver ADC need to be whole multiples of the baseband signal rate which is 1 MHz for Bluetooth if SRRC filters are to be used and the advantage of reduction of ISI obtained, however it is not necessary that the integer value be the same for both transmit and receive paths. Hence for the transmit side a value of 13 MHz can be used. However on the receive side it is preferred to use a fractional multiple of the baseband signal rate such as 6.5 MHz as the sampling frequency for the ADC 12. Accordingly, the received analog signals are digitized in the ADC 12 at a first sampling rate of 6.5 MHz to generate first digitized samples. However, this is a non-whole integer multiple of 1 MHz and would normally require a change in sampling frequency.

This problem is solved by inserting an interpolation filter 16 prior to the SRRC filter 18. Interpolation filters are well known to the skilled person and may be implemented in a variety of ways, e.g. polyphase filter, FIR, etc. The interpolation filter 16 runs at a fractional multiple of the baseband signal frequency such as 6.5 MHz and provides as its output estimates from the first digitized samples obtained at the sample rate of 6.5 MHz received from the ADC 12, second samples which would have been obtained if the sampling frequency of the received analog signal would have been a whole integer multiple of the baseband signal rate (1 MHz, for Bluetooth) e.g. 6 MHz. The interpolation filter 16 may be implemented in any suitable way, e.g. as a FIR filter with 2 taps. The taps of the filter 16 are changed every clock cycle to thereby generate the next sample.

For example, the output of the filter 16 can be represented as the following sequence:

ABCDEFGHILMNXOPQRSTUVZABCXDEFG . . .

If a real 6 MHz sampling had been carried out the sequence would be:

ABCDEFGHILMNOPQRSTUVZABCDEFG . . .

The output of filter 16 is an estimation of the samples which would have been obtained from the received analog signal if it would have been sampled at 6 MHz with the addition of one unused sample every 13 samples which is indicated with X in the sequences above. In accordance with the present invention the 13 samples obtained from the ADC 12 are interpolated to 12 values which are an estimate of the samples which would have been obtained if the sampling of the received analog signal would have been performed at 6 MHz and with the addition of one sample—the $13^{th}$. This $13^{th}$ sample would not have been included in samples at 6 MHz and is not used in subsequent processes in accordance with the present invention. In order to record the $13^{th}$ sample, a counter means 14 is provided. This counter means 14 transmits a suitable signal at each $13^{th}$ symbol to downstream components 30 in order to deactivate these components or otherwise ensure that the $13^{th}$ bits are not used. The counter means can be implemented in any suitable way known for counters.

For example, the first component affected in this way is the SRRC 18. An SRRC is a filter which approaches a Nyquist filter, i.e. one which has a perfect (vertical) cut-off. In fact an SRRC filter does not have a perfect cut-off but has a roll-off which means that the filtered output requires more bandwidth than a perfect Nyquist filter.

The complex digitized input signal to be supplied to the SRRC is split into the two real components: the in-phase and the in-quadrature digitized signals. At this point, each component is filtered by the SRRC filter 18. A FIR filter structure can be chosen for the implementation of the SRRC 18. The FIR filter is provided with coefficients (taps) to thereby perform SRRC filtering for both the complex signal components. It operates at 6.5 MHz clock frequency but has coefficients (taps) for processing samples at 6 MHz, i.e. the taps of the SRRC filter are configured to process symbols sampled at 6 MHz while the device is being operated at 6.5 MHz. This means that every $13^{th}$ sample received by the SRRC 18 must be ignored. This is achieved by the signal for the $13^{th}$ sample from the counting means 14 being received at the SRRC filter 18 and the SRRC 18 being adapted so that on receipt of this blocking signal it does not process this $13^{th}$ sample. The $13^{th}$ sample will have some indeterminate value and is not reliable. Hence it cannot be used in other downstream modules. The SRRC filter 18, the ADC 12, and the interpolating filter 14 can all be clocked at the same frequency, e.g. 6.5 Mhz, or a multiple thereof.

In the following some possible downstream components 30 are described. These are not limiting of the invention. As an example of possible downstream blocks the signal can be processed through a Vector Product block 20, 22. This block combines two digitized complex symbols delayed an interval. For example, one can be delayed by one sample period in block 20. Reference is made to U.S. Pat. No. 6,703,896 for further details which is incorporated herein by reference. The output of the vector product block 22 is used to obtain the symbol timing in block 24. A Symbol-Extraction block 26 selects one digitized symbol every T period in the position specified by the timing recovery block 24. This symbol is chosen among the 12 samples belonging to the digitized signal whereby the $13^{th}$ sample is ignored.

Demodulation, e.g. using π/4-DQPSK or 8-DPSK is carried out in demodulation block 28. This block 28 evaluates the phase difference of the selected sample. It recognizes in which region of the constellation points the received signal samples are located. For π/4-DQPSK a check is made in which phase quadrant the sample is located. For the 8-DPSK eight constellation regions are checked.

The receiver according to the present invention may be implemented as a program running on a personal computer. The above receiver can be implemented as an integrated circuit or by other means, e.g. on a Printed Circuit Board. The receiver according to the present invention may be implemented on an Integrated Circuit comprising an embedded processor. The processor may be a microprocessor or a programmable gate array such as a Field Programmable Gate array or any other suitable processing means.

In particular, software according to the present invention may include code segments which, when implemented on a processing engine, execute an interpolating filter to generate digitized samples which are estimates of samples obtainable by sampling a received analog signal at a second sample rate lower than a first sampling rate, the second digitized samples being output at the first sampling rate and including at least one unusable sample. The code may also implement a circuit for generating a signal for controlling other components than the interpolation filter to prevent processing of the unusable second digitized samples. The code may also implement an SRRC filter for receiving the second digitized samples, the SRRC filter being configured to process samples at the second sample rate. Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A receive path in a receiver comprising:
a means for generating first digitized samples from a received analog signal at a first sampling rate, an interpolating filter to generate second digitized samples which are estimates of samples obtainable by sampling the received analog signal at a second sample rate lower than the first sampling rate, the second digitized samples being output at the first sampling rate and including at least one unusable sample, and a circuit for generating a signal during the output of each of the at least one unusable samples for controlling components of the receive path downstream of the interpolation filter to prevent processing of the unusable second digitized samples.

2. The receive path according to claim 1, further comprising an SRRC (Square Root Raised Cosine) filter for receiving the second digitized samples, the SRRC filter being configured to process samples at the second sample rate.

3. The receive path according to claim 1, wherein the circuit for generating a signal is a counter.

4. The receive path according to claim 1, wherein the receiver is a Bluetooth receiver.

5. The receive path according to claim 1, wherein the first sampling rate is a fractional multiple of the baseband signal rate.

6. The receive path according to claim 5, wherein the second sampling rate is an integer multiple of the baseband signal rate.

7. The receive path according to claim 1, wherein the means for generating first digitized samples is an analog to digital converter.

8. The receive path according to claim 7, wherein the analog to digital converter, the interpolation filter and an SRRC (Square Root Raised Cosine) filter are all clocked at the same frequency.

9. A method of operating a receiver comprising:
generating first digitized samples from a received analog signal at a first sampling rate,
interpolating the first digitized samples to generate second digitized samples which are estimates of samples obtainable by sampling the received analog signal at a second sampling rate lower than the first sampling rate, the second digitized samples being output at the first sampling rate and including at least one unusable sample, and
generating a signal during the output of each of the at least one unusable samples for controlling components of the receive path downstream of the interpolation filter to prevent processing of the unusable second digitized samples.

10. The method according to claim 9, further comprising SRRC (Square Root Raised Cosine) filtering the second digitized samples, the SRRC filtering being configured to process the second digitized samples at the second sample rate.

11. The method according to claim 9, wherein controlling components of the receive path downstream of the interpolation filter to prevent processing of the unusable second digitized samples comprises transmitting a signal during the output of each of the at least one unusable samples to deactivate the components of the receive path downstream of the interpolation filter.

12. A receive path in a receiver comprising:
an analog-to-digital converter configured to output, at a first sampling rate, first digitized samples from a received analog signal;
an interpolation filter configured to interpolate the first digitized samples to output second digitized samples at the first sampling rate, the second digitized samples comprising data samples and at least one unusable sample, the data samples being estimates of samples obtainable by sampling the received analog signal at a second sampling rate lower than the first sampling rate; and
a signal-generating circuit configured to generate a blocking signal when the interpolation filter outputs the at least one unusable sample; and
a downstream component downstream of the interpolation filter, the downstream component configured to process the second digitized samples and when the downstream component receives the blocking signal, to ignore the at least one unusable sample by not processing the at least one unusable sample.

13. The receive path according to claim 12, wherein the downstream component comprises an SRRC (Square Root Raised Cosine) filter, the SRRC filter being configured to process the second digitized samples at the second sampling rate.

14. The receive path according to claim 12, wherein the signal-generating circuit comprises a counter.

15. The receive path according to claim 12, wherein the receiver comprises a Bluetooth receiver.

16. The receive path according to claim 12, wherein the first sampling rate is a fractional multiple of the baseband signal rate.

17. The receive path according to claim 16, wherein the second sampling rate is an integer multiple of the baseband signal rate.

18. The receive path according to claim 12, wherein the interpolation filter is configured to periodically generate an unusable sample of the at least one unusable samples after a first number of data samples.

19. The receive path according to claim 18, wherein the signal-generating circuit comprises a counter configured to periodically generate a blocking signal after the first number of data samples.

20. The receive path according to claim 12, wherein the analog-to-digital converter, the interpolation filter and the downstream component are clocked at a same frequency.

* * * * *